US008575943B2

(12) United States Patent
Emanuel et al.

(10) Patent No.: US 8,575,943 B2
(45) Date of Patent: Nov. 5, 2013

(54) APPARATUS AND METHOD FOR GENERATING A DEFINED CHARGE PULSE FOR CARRYING OUT A PARTIAL DISCHARGE MEASUREMENT

(75) Inventors: Harald Emanuel, Berlin (DE); Vincent Boschet, Berlin (DE)

(73) Assignee: Mtronix Precision Measuring Instruments GmbH, Berlin (DE)

( * ) Notice: Subject to any disclaimer, the term of this patent is extended or adjusted under 35 U.S.C. 154(b) by 658 days.

(21) Appl. No.: 12/747,296

(22) PCT Filed: Oct. 27, 2008

(86) PCT No.: PCT/EP2008/009068
§ 371 (c)(1),
(2), (4) Date: Jul. 8, 2010

(87) PCT Pub. No.: WO2009/074193
PCT Pub. Date: Jun. 18, 2009

(65) Prior Publication Data
US 2010/0295555 A1     Nov. 25, 2010

(30) Foreign Application Priority Data

Dec. 10, 2007 (EP) .................... 07023864

(51) Int. Cl.
*G01R 31/08* (2006.01)

(52) U.S. Cl.
USPC .... 324/536; 307/106; 324/76.65; 324/762.02

(58) Field of Classification Search
USPC .......................... 324/536; 307/106
See application file for complete search history.

(56) References Cited

U.S. PATENT DOCUMENTS

| | | | | |
|---|---|---|---|---|
| 4,401,948 A * | 8/1983 | Miura et al. | ................ | 324/378 |
| 4,852,810 A * | 8/1989 | Behr et al. | ................. | 239/703 |
| 5,003,965 A * | 4/1991 | Talish et al. | ................... | 601/2 |
| 6,242,900 B1 * | 6/2001 | Fawcett et al. | ............ | 324/76.65 |
| 6,432,524 B1 * | 8/2002 | Fromm et al. | ............. | 428/313.3 |
| 6,943,308 B2 * | 9/2005 | Ravnkilde et al. | ........... | 200/200 |
| 7,119,597 B1 * | 10/2006 | Barrett et al. | ................ | 327/291 |
| 7,489,052 B2 * | 2/2009 | Hatano et al. | ................ | 307/106 |
| 7,560,948 B2 * | 7/2009 | Grund | ....................... | 324/762.01 |
| 2001/0020653 A1 * | 9/2001 | Wilson et al. | ................ | 239/690 |
| 2002/0014890 A1 * | 2/2002 | Cooke | .......................... | 324/536 |

(Continued)

FOREIGN PATENT DOCUMENTS

| | | |
|---|---|---|
| DE | 39 12 654 | 3/1990 |
| JP | 2003207536 A * | 7/2003 |

OTHER PUBLICATIONS

International Preliminary Report on Patentability for PCT/EP2008/009068 mailed on Jun. 24, 2010.

(Continued)

*Primary Examiner* — Melissa Koval
*Assistant Examiner* — Benjamin M Baldridge
(74) *Attorney, Agent, or Firm* — Workman Nydegger

(57) ABSTRACT

A calibrator apparatus for calibrating the performance of partial discharge measurements at electrical components, such as high voltage cables or transformers, comprises a housing (1) and an external electrode (4) to be mounted at the housing (1). A control unit (2) generates a defined charge pulse ($Q_S$) depending on a stray capacitance ($C_S$) of the external electrode (4) against ground, which is supplied to the electrical component.

29 Claims, 2 Drawing Sheets

(56) References Cited

U.S. PATENT DOCUMENTS

Figure 1:
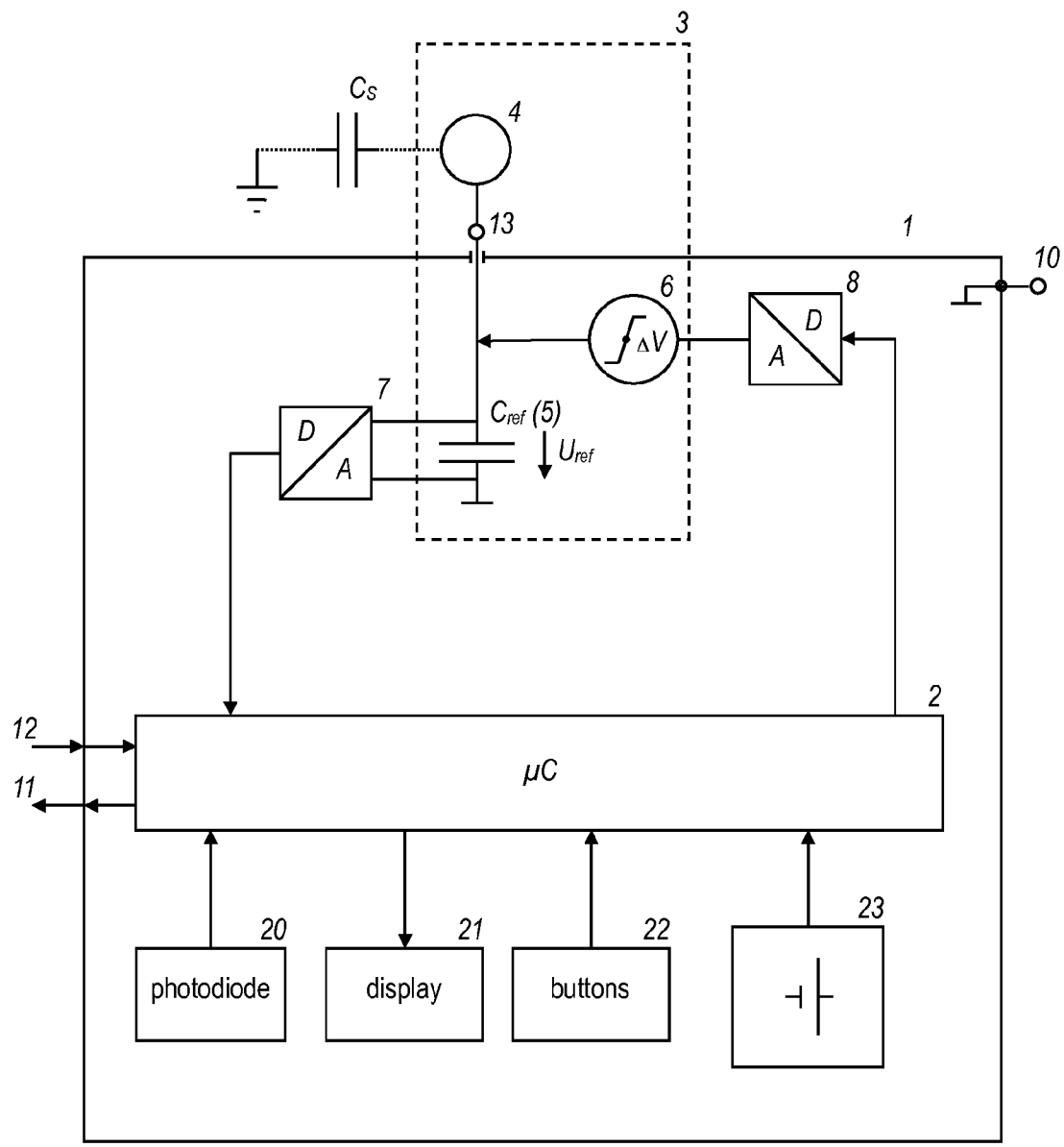

| | | | |
|---|---|---|---|
| 2005/0128655 A1* | 6/2005 | Cuevas et al. | 361/18 |
| 2006/0111756 A1* | 5/2006 | Chang | 607/48 |
| 2007/0009202 A1* | 1/2007 | Chan et al. | 385/18 |
| 2007/0057677 A1* | 3/2007 | Koch et al. | 324/536 |
| 2007/0063709 A1* | 3/2007 | Goodrich et al. | 324/536 |
| 2007/0159205 A1* | 7/2007 | Grund | 324/765 |
| 2008/0077190 A1* | 3/2008 | Kane et al. | 607/37 |
| 2008/0180126 A1* | 7/2008 | Okayasu et al. | 324/763 |

OTHER PUBLICATIONS

International Search Report from PCT/EP2008/009068, Oct. 27, 2008.

\* cited by examiner

APPARATUS AND METHOD FOR GENERATING A DEFINED CHARGE PULSE FOR CARRYING OUT A PARTIAL DISCHARGE MEASUREMENT

The present invention relates to an apparatus for generating a defined charge pulse for performing a partial discharge measurement as well as a corresponding method. According to a preferred embodiment, the present invention relates to the generation of defined charge pulses for performing partial discharge measurements or insulation tests of electrical components, such as cables, rotating machines, transformers etc., whereby the invention preferably is applicable to high voltage discharge measurements without, however, being restricted thereto, in order to recognize insulation mistakes at high voltage components by means of partial discharge tests and insulation tests, respectively.

Partial discharge phenomena indicate in many cases insulation mistakes of electrical components, in particular of high voltage components. Thus, the monitoring, recognition, localization, recordation and analysis of partial discharge phenomena is a requirement for a reliable protection against breakdowns and repairs that may be very cost-intensive later on. Therefore, highly precise and modular partial discharge measurement systems are already being offered for the recognization, recordation and analysis of partial discharge events in a broad spectrum of applications, allowing the monitoring and detection of partial discharges both for applications in a laboratory as well as for on-site measurements. Thereby, all kinds of electrical components can be analyzed, such as transformers, rotating machines and cable networks (including high voltage cables and ultra high voltage cables).

In order to allow for the performance of reliable partial discharge measurements, partial discharge calibrators are used, which are directly coupled with a test object and continuously generate charge pulses during a calibration process so that the respective partial discharge measurement device detects these pulses during the duration of the calibration. By means of the detected pulses a function control of the measurement device is possible. More important, however, is the determination of the so-called calibration factor. The pulses generated by the calibrator are attenuated in dependence upon the measurement configuration (primarily depending on the capacity of the device under test and the capacity of the coupling capacitor, respectively, but also depending on the physical expansion and the measurement frequency). The calibration factor compensates for this attenuation; it must be determined newly for each change of the measurement configuration.

A square wave voltage jump and a precise capacitor may be used in order to generate the defined calibration charge pulses, whereby a capacitor installed in the calibrator usually withstands voltages up to 500 V only. By using an external high voltage capacitor a calibration may be performed during a high voltage measurement, whereby, however, such high voltage capacitors on the one hand are relatively expensive and, on the other hand, significantly increase the size of the calibrator. In addition, such injection capacitors in cooperation with the coupling capacity and the capacity of the device under test have an adverse effect on the sensitivity of the partial discharge measurement device. Furthermore, there is the risk that the injection capacitor itself is not free of partial discharges and, consequently, affects the measurement.

A further problem associated with known calibrators resides in that, due to the measurements to be performed at high voltages, the conductors between the measurement object and the calibrator have to be correspondingly long whereby, however, the calibration pulse is altered by the inductivity of the conductor, and considerable mistakes may occur during the measurement depending on the measurement place and the measurement frequency.

Therefore, it is the object of the present invention to provide an apparatus as well as a method for generating a defined charge pulse for performing a partial discharge measurement at an electrical component, which allow to eliminate the above-mentioned problems. In particular, it is the object of the invention to provide an apparatus and a method for generating defined charge pulses for performing high voltage partial discharge measurements at high voltage components, such as transformers, rotating machines or cables, which allow for a cost-efficient, reliable and easy to handle calibration when performing the high voltage partial discharge measurements.

According to the invention, this object is achieved by an apparatus having the features of claim 1 and a method having the features of claim 25, respectively. The dependent claims each define preferred and advantageous embodiments of the present invention.

According to the invention, an apparatus for generating a defined charge pulse for performing a partial discharge measurement at an electrical component is provided, whereby the apparatus comprises a housing, an external electrode to be mounted at the housing, and a control unit. The control unit is designed such that it generates the defined charge pulse in dependence on a stray capacitance of the external electrode.

The external electrode is to be attached externally to the housing of the apparatus of the present invention, which in the following will also be referred to as a calibrator apparatus or simply as a calibrator, whereby the stray capacitance is defined between the external electrode and ground. According to the invention, this stray capacitance is used instead of a discrete high voltage capacitor for the application of calibration pulses and charge pulses, respectively, for the performance of partial discharge measurements. Therefore, no additional connecting wires are necessary to connect the output terminal with the test object. Instead thereof, the apparatus of the invention can be directly and substantially non-inductively connected to the test object so that the stray capacitance is close to the test object and the parasitic effects caused by the connecting wires are negligible. Consequently, the calibration can be performed more precisely and more reliably, which also results in an improved quality and reproducibility of the corresponding partial discharge measurements.

Since, according to the invention, an external electrode with a stray capacitance against ground is used instead of an external high voltage capacitor, the size of the device and the cost of manufacture can be reduced significantly.

According to a preferred embodiment, parameters for the calibration to be performed, such as the desired charge level of the charge pulse, may be input, whereby the device automatically calculates the voltage jump to be generated by an internal voltage source depending on these parameters and the stray capacitance of the external electrode in order to be able to supply the desired charge to the test object via the output of the device.

In general, the stray capacitance of the external electrode is unknown and depends on the conditions at the site of operation. For an open-air use, the stray capacitance can be estimated under certain circumstances, for example when using a spherical electrode upon absence of metallic objects in the vicinity of the external electrode. When knowing the stray capacitance, the device can automatically calculate the internal voltage jump that is necessary for the desired charge pulse.

However, if the stray capacitance is not known and cannot be estimated, either, according to a preferred embodiment, an internal self calibration is performed such that initially the stray capacitance at the site of operation is determined by means of a trial measurement in order to be able to subsequently calculate the voltage jump necessary for the generation of the desired charge pulse on the basis of the knowledge of this stray capacitance. For this purpose, the external electrode or the stray capacitance formed by the external electrode against ground may be connected with an internal reference capacitance such that both capacitances form a voltage divider, whereby for performing the trial measurement a high voltage generated by the external trial voltage source is applied and precisely detected by the partial discharge measurement device. At this point in time, the internal voltage source in the calibrator is deactivated.

The voltage drop at the internal reference capacitance is evaluated automatically, whereby the stray capacitance can be determined on the basis of the knowledge of the internal reference capacitance, the voltage drop at the reference capacitance, and the voltage applied for performing the trial measurement.

The calibrator of the invention can be connected to the test object both for performing a single partial discharge measurement and permanently for monitoring purposes and may have keys or buttons for adjusting the charge to be generated as well as a display for displaying the charge. Furthermore, the calibrator uses according to a preferred embodiment an optical input for controlling the calibrator, whereby the calibrator can be coupled via this optical interface with a partial discharge measurement device in order to be able to switch on/switch off the calibrator via the partial discharge measurement device and to adjust important parameters of the calibrator, such as the charge level, the charge polarity or the pulse repetition rate. In addition, the calibrator may have an optical output for the transmission of measurement data to the partial discharge measurement device. The operation at a potential requires an electrically insulating interface between the calibrator and the control device. In addition, this results in a significantly increased security and measurement accuracy for high voltage measurement tasks, and the formation of ground loops is avoided, whereby interference effects can be reduced, and the sampling sensitiveness can be improved.

In addition, a plurality of completely synchronously working partial discharge measurement devices may be installed separated long distances from one another without losing the measurement accuracy, whereby the individual connected measurement devices are each completely galvanically separated from one another. The control of the individual partial discharge measurement devices as well as of the calibrator is performed by a central control site, preferably in the form of a central control personal computer.

According to a preferred embodiment, the apparatus of the invention is a battery-operated portable device being configured in conformity with the established standards (when performing high voltage partial discharge measurements IEC 60270 and IEEE 454). When using an optical interface for controlling the calibrator, only the optical receiver of the calibrator has to be continuously switched on, whereby such an optical receiver has an extremely low current consumption so that battery operation for up to ten years or more is possible. The lifetime of the battery should be chosen such that the lifetime of the battery is a multiple of the time interval according to which an inspection of the performance of the calibrator has to be carried out in conformity with the established international standards. By providing the battery operation, the calibrator can be operated at a high voltage potential without any security risk.

According to an embodiment of the invention, the calibrator of the invention is a potential-free online partial discharge calibrator which can be used in particular for performing high voltage partial discharge measurements at electrical components, for example cables, rotating machines or transformators, in a laboratory or on-site. However, the invention is not restricted to this preferred range of application, but the invention can be used everywhere where calibration charge pulses are to be generated and are to be applied to a test object for performing partial discharge measurements. For example, the invention can also be used for partial discharge tests or insulation tests at optocouplers, power semiconductors, capacitors, resistors, choke coils, relays and the like.

The calibrator according to the invention may be delivered or may be used with one external electrode or with a set of different external electrodes. The stray capacitance of the external electrode should have a radius as large as possible for the generation of higher charges so that, according to an embodiment of the invention, a spherical shape, a hemispherical shape, or a toroid may be used as the external electrode. For the generation of even higher charges, the external electrode may be brought in the vicinity of the earth's field. Preferably, the external electrode should not have any peaks or edges as otherwise corona discharges may occur which may affect the accuracy for the generation of the calibration pulses. Since external disturbances or changes of the external influences have stronger effects when using relatively large external electrodes, it is advantageous to use geometries as small as possible for the external electrode. It is possible to integrate the external electrode into the calibrator housing.

With one external electrode a dynamic range of the producible amount of charge of 1:100 can be realized. Larger amounts of charge can be generated by using different external electrodes. For this reason it is advantageous when the calibrator is delivered together with a set of different external electrodes which each realize optimum results for different applications. Generally, the external electrodes should be free of partial discharge in each case, whereby, however, small partial discharges are acceptable for the calibration of electrical machines.

In practice, the voltage jump realized with the aid of the internal voltage source for the generation of the calibration pulse should be as large as possible in order to allow a reliable calibration of the respective electrical component. For this purpose, according to an embodiment, the calibrator for example may have an internal 90 V voltage source which is controlled by an internal control unit, preferably in the form of a microcontroller. In order to have a sufficient reserve, usually a maximum voltage jump of 80 V is generated with such a 90 V voltage source for generating the calibration pulses.

According to a further preferred embodiment of the invention, the calibrator may have a photodiode or the like with the aid of which the calibrator can be synchronized by detecting a light source operated with the mains voltage in order to achieve a calibration that is synchronous with the mains. Likewise, the individual partial discharge measurement devices, which are operated together with the calibrator according to the invention, may each include such a photodiode for synchronization with a light source operated with the mains voltage.

In order to make the calibrator to a large extent independent from external influences, the calibrator or its external electrode may be arranged in a device shielding external influences that generate a pre-defined electrical field in the interior of the device. According to an embodiment, this predefined structure comprises two toroids, whereby one toroid is at ground potential and the other toroid is at a high potential. In general, it is advantageous to keep a predefined space around the calibrator free from any grounded objects or objects that are at a higher potential in order to reduce external influences.

In the following, the invention will be explained in more detail by means of preferred embodiments with reference to the accompanying drawing. Thereby, the invention will be described in particular by means of the example of the generation of calibration pulses for performing high voltage partial discharge measurements at electrical components, especially at high voltage operating equipment. However, the invention is not limited to this preferred application, but may be used everywhere where defined charge pulses are to be generated for performing partial discharge measurements.

Figure 2:
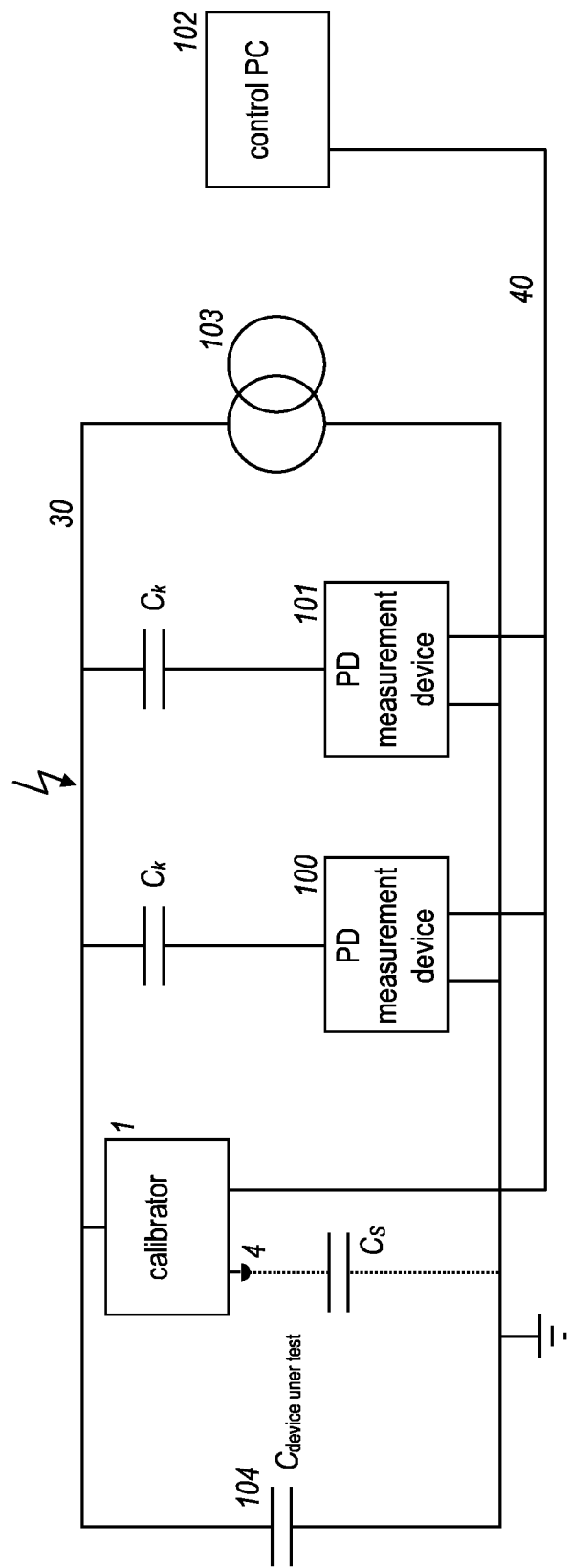

FIG. 1 shows a simplified block diagram of an apparatus for generating defined charge pulses for performing partial discharge measurements at electrical components according to a preferred embodiment of the invention, and FIG. 2 shows a schematic depiction for illustrating the use of the apparatus shown in FIG. 1 together with corresponding partial discharge measurement devices for an online-calibration during a partial discharge measurement.

FIG. 1 shows a simplified block diagram of a calibration apparatus or of a calibrator for generating a defined charge pulse for performing partial discharge measurements at electrical components according to an embodiment of the present invention, whereby the calibrator shown in FIG. 1 is especially a calibrator for performing high voltage partial discharge measurements at high voltage power lines, transformators, and the like.

The calibrator shown in FIG. 1 is a portable device which can be directly connected with a test object. For this purpose, the calibrator has a terminal 10, via which predefined calibration charge pulses are output to the test object, whereby these calibration charge pulses are in particular continuously generated during the performance of a high voltage partial discharge measurement in order to allow for a continuous calibration and a continuous self-test of the corresponding partial discharge measurement device even in the case of changing measurement conditions.

The housing 1 of the calibrator comprises a further terminal 13 to which an external electrode 4 is to be connected. In the example depicted in FIG. 1, the external electrode 4 has a spherical shape with other shapes, such as a hemispherical shape or a toroid, being possible as well. The external electrode 4 defines stray capacitances $C_S$ against earth/ground, which are shown in FIG. 1 by corresponding arrows. These stray capacitances $C_S$ of the external electrode 4 are used by the calibrator for the generation of calibration charge pulses to be output via the terminal 10 to the test object, as it will be explained in the following in more detail.

The calibrator comprises an internal battery 23 or an accumulator so that the calibrator can be operated without an external energy supply. Furthermore, the calibrator has buttons/keys or other input means 22 by means of which the calibrator can be controlled, whereby in particular the desired charge level as well as the charge polarity of the calibration charge pulses to be output via the terminal 10 to the test object can be defined for the calibrator in this manner.

As shown in FIG. 1, the calibrator comprises a display 21 for displaying the values adjusted through the input means 22, especially for displaying the adjusted charge level. Furthermore, the calibrator comprises a photodiode 20 by means of which the calibrator can be synchronized by detecting a light source operated with the mains voltage.

In operation, the control of the calibrator is substantially effected through an optical terminal 12 which is connected with a partial discharge measurement device or a central control device through a glass fiber cable. In this way, the calibrator can be remotely controlled and can be switched on/off galvanically decoupled, and through the optical terminal 12 several parameters such as the charge level and the charge polarity as well as the repetition rate of the charge pulses to be output via the terminal 10 can be adjusted. The calibrator also has an optical output 11 for the transmission of measurement results to a partial discharge measurement device or to the central control device connected thereto.

The external electrode 4 is coupled with an internal reference capacitance 5 having a known value $C_{ref}$ such that the stray capacitance $C_S$ of the external electrode 4 forms together with the internal reference capacitance 5 a capacitive voltage divider. The external electrode 4 and the corresponding capacitance voltage divider, respectively, are controlled by an adjustable voltage source 6 (for example a 90 V voltage source) such that the charge $Q_S$ stored in the external electrode 4 due to the stray capacitance $C_S$ can be output as a calibration charge pulse via the terminal 10. For this purpose, a voltage jump $\Delta V$ is applied by the voltage source 6 to the external electrode resulting in the following relation for the output charge:

$$Q_S = C_S \cdot \Delta V$$

The calibrator depicted in FIG. 1 comprises a central control unit in the form of a microcontroller 2 which can be remotely controlled via the optical terminal 12 as described above. In case the stray capacitance $C_S$ of the external electrode 4 is known, the microcontroller 2 can calculate in a simple way the amount of the voltage jump $\Delta V$ which is necessary in order to output the desired charge and the desired charge pulse $Q_S$, respectively, to the test object in response to the voltage jump $\Delta V$.

However, due to external interferences which in particular are dependent on the type and the position of the connection of the calibrator to the test object, the stray capacitance $C_S$ of the entire high voltage configuration comprising the calibrator 1 and the high voltage test object is usually unknown. Consequently, according to a preferred embodiment, the calibrator depicted in FIG. 1 comes with a self-calibration function which allows to determine the value of the stray capacitance $C_S$ in advance.

As already explained, the stray capacitance $C_S$ forms together with the internal reference capacitance 5 whose value $C_{ref}$ is known a capacitive voltage divider. For performing the self-calibration, the high voltage source 103 of the test-setup is adjusted to a voltage value which is precisely determined by the measurement device 100. At this point in time, a voltage $U_{ref}$ being dependent from the capacitance $C_S$ drops across the internal reference capacitance 5. This voltage $U_{ref}$ is detected and is supplied to the microcontroller 2 via an analog/digital converter 7. The microcontroller 2 can then determine the value of the stray capacitance $C_S$ from the known value $C_{ref}$ of the international reference capacitance 5, the known value of the applied test voltage (which is transmitted by the measurement device 100 via the optical connection 40) and the voltage drop $U_{ref}$ across the reference capacitance 5 as measured through the analog/digital converter 7. Since now the stray capacitance $C_S$ is known, the microcontroller 2 can calculate the voltage jump $\Delta V$ to be applied to the external electrode 4, which is necessary in order to realize the desired charge pulse $Q_S$.

During the performance of a partial discharge measurement a continuous calibration is possible. In this case, the microcontroller 2 permanently monitors the respective current value of the stray capacitance $C_S$ so as to readjust the voltage jump $\Delta V$ accordingly, if necessary.

From FIG. 1 it is evident that, in this way, the calibrator in principle comprises a charge source 3 which comprises as individual components the variable voltage source 6 as well as the external electrode 4 with its stray capacitance $C_S$. Therefore, $C_S$ is not represented by a physical element, but it is defined by the electrode 4 and the environment being at ground potential. This charge source 3 is controlled by the microcontroller 2 depending on the respective actual value of the stray capacitance $C_S$ through a digital/analog converter 8 such that the desired charge pulse $Q_S$ is impressed at the terminal 10 of the calibrator, which is to be connected to the high voltage test object.

The pulse duration of the calibration charge pulses as well as the pulse repetition rate are adjustable and, for example, may amount 50 ns and 500 Hz, respectively. Common values for the pulse repetition rate, for example, lie between 50 Hz and several hundreds Hz up to ca. 1.2 KHz. The charge level of the calibration pulse, for example, may range from 1 pC to 1 nC.

If the above-described self-calibration process, contrary to the expectations, does not lead to the generation of calibration charge pulses within a predefined tolerance error range due to the given operating conditions, several measures may be taken to solve this problem.

For example, an offline-calibration may be performed with a conventional calibrator at the site of operation, and subsequently the calibrator depicted in FIG. 1 may be adjusted on the basis of the calibration factor determined by means of the conventional calibrator. Then, the calibrator of FIG. 1 can remain in the configuration during the entire measurement, a possibly existing influence of the high voltage source 103 switched off for the offline-calibration will be noticed immediately.

Likewise it is possible to keep the calibrator and its external electrode 4, respectively, free from any grounded parts or any parts being at a significant voltage potential within a predefined space.

Alternatively, the calibrator and its external electrode 4, respectively, may be arranged within a predefined shielding device as well, whereby the calibrator and the external electrode are shielded against external influences. For example, the calibrator may be arranged in a grounded container or between two toroids, one of which being at ground potential and the other one being at a high potential.

In general, it is advantageous to use a structure for the external electrode 4, which is less susceptible to external influences. For example, in particular at least partly spherical external electrode shapes may be used, whereby in addition the at least partly spherical electrode may be arranged in a toroid-shaped body connected with the housing 1 of the calibrator.

FIG. 2 shows a strongly simplified schematic illustration of the operation of the calibrator 1 depicted in FIG. 1 with a plurality of high voltage partial discharge measurement devices 100, 101, which are electrically connected through a conductor 30 with a test object 104, represented by a capacitance $C_{device\ under\ test}$ in the example shown in FIG. 2, for performing high voltage partial discharge measurements, and with a high voltage source 103. The calibrator 1 is also connected to the test object 104 via the terminal 10 shown in FIG. 1. The calibrator does not have a direct connection to ground potential. Furthermore, the calibrator 1 is connected with the control PC 102 via the optical terminals 11, 12, which are also shown in FIG. 1, and by means of a glass fiber network 40.

Through this glass fiber network 40, measurement and control information may be exchanged galvanically decoupled between the control PC 102, the calibrator 1 and the measurement devices 100, 101, whereby in addition a simple and reliable synchronization of the calibrator 1 and the individual measurement devices 100, 101 is possible.

The separate central control device 102 is arranged outside the danger area and controls the calibrator 1 as well as the individual partial discharge measurement devices 100, 101 through the glass fiber network 40.

The invention claimed is:

1. An apparatus for generating a defined charge pulse for performing a partial discharge measurement, comprising
a housing,
an external electrode to be mounted on an exterior surface of the housing, and
a control unit that determines a stray capacitance of the external electrode and that generates a charge pulse in dependence on the determined stray capacitance such that a defined charge pulse is output by the external electrode at a predefined charge level for performing a partial discharge measurement at an electrical component.

2. The apparatus according to claim 1, further comprising a battery or an accumulator for supplying the apparatus with energy.

3. The apparatus according to claim 1, wherein the apparatus is configured in the form of a portable device.

4. The apparatus according to claim 1, further comprising an input device for setting the predefined charge level.

5. The apparatus according to claim 1, further comprising a display device for displaying status information of the apparatus.

6. The apparatus according to claim 1, further comprising an optical interface for remote controlling the apparatus via a glass fiber conductor to be connected to the optical interface.

7. The apparatus according to claim 1, further comprising a controllable voltage source configured and connected to the external electrode such that by applying a voltage jump a charge stored in the external electrode due to the stray capacitance can be output as a charge pulse via a terminal of the apparatus.

8. The apparatus according to claim 7, wherein the control unit is configured to determine the voltage jump required for achieving the defined charge pulse depending on the stray capacitance of the external electrode, and to control the controllable voltage source accordingly.

9. The apparatus according to claim 7, wherein the control unit is configured to determine the stray capacitance of the external electrode automatically and to generate in response thereto the charge pulse by correspondingly controlling the voltage source.

10. The apparatus according to claim 9, wherein the control unit applies a known voltage to a capacitive voltage divider comprising the stray capacitance of the external electrode and a known internal reference capacitance to determine the stray capacitance of the external electrode by evaluating the voltage drop at the known internal reference capacitance depending on the known voltage and depending on the known value of the internal reference capacitance.

11. The apparatus according to claim 9, wherein the apparatus is configured to continuously determine the stray capacitance of the external electrode.

12. The apparatus according to claim 1, further comprising a light detecting device for synchronizing the operation of the apparatus with an external light source.

13. The apparatus according to claim 1, wherein the external electrode is detachably coupleable to the housing.

14. The apparatus according to claim 1, wherein the external electrode is part of the housing.

15. The apparatus according to claim 1, wherein the external electrode comprises an at least partially spherical surface.

16. The apparatus according to claim 1, wherein the external electrode comprises a spherical or semispherical surface.

17. The apparatus according to claim 1, wherein the external electrode comprises a toroid-shaped surface.

18. The apparatus according to claim 1, wherein the external electrode comprises an at least partially spherical electrode surface arranged in a toroid-shaped electrode body, wherein the toroid-shaped electrode body is to be coupled to the housing.

19. The apparatus according to claim 1, further comprising a shielding device for shielding the external electrode against external interferences, wherein the external electrode is to be arranged inside the shielding device.

20. The apparatus according to claim 19, wherein the shielding device comprises a grounded container in which the external electrode is to be arranged.

21. The apparatus according to claim 19, wherein the shielding device comprises a first toroid-shaped body and a second toroid-shaped body, wherein the first toroid-shaped body is at ground potential and the second toroid-shaped body is at a higher voltage potential than the first toroid-shaped body, and wherein the external electrode is to be arranged inside the two toroid-shaped bodies.

22. A measurement system for performing a partial discharge measurement at an electrical component, comprising
at least one partial discharge measurement device for performing a partial discharge measurement at the electrical component, and
an apparatus for generating a defined calibration charge pulse for calibrating the performance of the partial discharge measurement by the at least one partial discharge measurement device, wherein the apparatus comprises:
a housing,
an external electrode to be mounted at on an exterior surface of the housing, and
a control unit that determines a stray capacitance of the external electrode and to that generates a charge pulse in dependence on the determined stray capacitance such that a defined charge pulse is output by the external electrode at a predefined charge level for performing a partial discharge measurement at an electrical component.

23. The measurement system according to claim 22, wherein the measurement system is configured to perform high voltage partial discharge measurements.

24. The measurement system according to claim 22, wherein the measurement system is configured to perform partial discharge measurements at a cable or a transformer as the electrical component.

25. The measurement system according to claim 22, wherein the apparatus for generating the defined calibration charge pulse and the at least one partial discharge measurement device are coupled via a glass fiber link.

26. A method for generating a defined charge pulse for performing a partial discharge measurement, comprising
determining a stray capacitance of an external electrode of an apparatus for generating a defined charge pulse for performing a partial discharge measurement, and
generating a charge pulse that is dependent on the determined stray capacitance and that is dependent on a charge stored in the external electrode due to a voltage jump such that a predefined charge pulse is output by the external electrode.

27. The method according to claim 26, wherein the defined charge pulse is generated using an apparatus according to claim 1.

28. The method according to claim 26, further comprising performing a partial discharge measurement at an electrical component using the predefined charge pulse output by the external electrode.

29. An apparatus for generating a defined charge pulse for performing a partial discharge measurement at an electrical component, the apparatus comprising:
a housing;
an external electrode to be mounted at the housing;
a control unit configured to generate the defined charge pulse in dependence on a stray capacitance of the external electrode; and
a controllable voltage source configured and connected to the external electrode such that by applying a voltage jump a charge stored in the external electrode due to stray capacitance of the electrode can be output as a charge pulse via a terminal of the apparatus,
wherein the apparatus is configured to automatically determine the stray capacitance of the external electrode and generate in response thereto the defined charge pulse by correspondingly controlling the voltage source, and
wherein the control unit is configured such that, for determining the stray capacitance of the external electrode by correspondingly controlling the voltage source, the control unit applies a known voltage to a capacitive voltage divider comprising the stray capacitance of the external electrode and a known internal reference capacitance to subsequently determine the stray capacitance of the external electrode by evaluating the voltage drop at the known internal reference capacitance depending on the known voltage and depending on the known value of the internal reference capacitance.

* * * * *